United States Patent
Wang et al.

(10) Patent No.: US 11,445,278 B2
(45) Date of Patent: Sep. 13, 2022

(54) DISPLAY PANEL BUFFERING STRUCTURE, DISPLAY SCREEN MODULE AND MANUFACTURING METHOD THEREFOR, AND TERMINAL DEVICE

(71) Applicants: Chengdu BOE Optoelectronics Technology Co., Ltd., Chengdu (CN); BOE Technology Group Co., Ltd., Beijing (CN)

(72) Inventors: Fengxian Wang, Beijing (CN); Qiang Tang, Beijing (CN)

(73) Assignees: Chengdu BOE Optoelectronics Technology Co., Ltd., Chengdu (CN); Beijing BOE Technology Development Co., Ltd., Beijing (CN)

( * ) Notice: Subject to any disclaimer, the term of this patent is extended or adjusted under 35 U.S.C. 154(b) by 0 days.

(21) Appl. No.: 17/264,481

(22) PCT Filed: May 29, 2020

(86) PCT No.: PCT/CN2020/093408
§ 371 (c)(1),
(2) Date: Jan. 29, 2021

(87) PCT Pub. No.: WO2020/239091
PCT Pub. Date: Dec. 3, 2020

(65) Prior Publication Data
US 2021/0321180 A1 Oct. 14, 2021

(30) Foreign Application Priority Data
May 30, 2019 (CN) .......................... 201910464036.8

(51) Int. Cl.
*H04R 7/04* (2006.01)
*H04R 1/02* (2006.01)
*H05K 7/20* (2006.01)

(52) U.S. Cl.
CPC ........... *H04R 1/02* (2013.01); *H05K 7/20963* (2013.01); *H04R 2499/15* (2013.01)

(58) Field of Classification Search
CPC ............ H04R 2440/05; H04R 2499/11; H04R 2499/15
See application file for complete search history.

(56) References Cited

U.S. PATENT DOCUMENTS 10,048,927 B2 * 8/2018 Brodkin ..................... B06B 3/00
10,574,803 B2 * 2/2020 Shim .................... H04M 1/0266
(Continued)

FOREIGN PATENT DOCUMENTS

CN   105720023 A   6/2016
CN   107786696 A   3/2018
(Continued)

OTHER PUBLICATIONS

Chinese Office Action for corresponding 201910464036.8 dated Mar. 17, 2021.

*Primary Examiner* — Ryan Robinson
(74) *Attorney, Agent, or Firm* — ArentFox Schiff LLP; Michael Fainberg

(57) ABSTRACT

A display panel buffering structure, a display screen module and a preparing method therefor, and a terminal device are provided. The display panel buffering structure is arranged on the side face, facing away from a light-emitting side, of a display panel, and comprises: a buffering film provided with a hollow structure for accommodating an exciter; and a first light shielding film attached to a first side face, facing the display panel, of the buffering film. An orthographic projection of the first light shielding film on a plane where the first side face is located covers an orthographic projection of the hollow structure on the plane where the first side face is located, and a portion, opposite to the hollow (Continued)

structure, of the first light shielding film is fixed with the exciter.

20 Claims, 8 Drawing Sheets

(56) References Cited

U.S. PATENT DOCUMENTS

| | | | |
|---|---|---|---|
| 11,079,811 B2* | 8/2021 | Ahn | H04R 1/24 |
| 2017/0077169 A1 | 3/2017 | Masuda et al. | |
| 2019/0014402 A1 | 1/2019 | Ahn et al. | |
| 2019/0050024 A1* | 2/2019 | Ahn | H04N 5/642 |
| 2019/0116405 A1 | 4/2019 | Noh et al. | |
| 2019/0196298 A1 | 6/2019 | Noh et al. | |
| 2019/0197281 A1* | 6/2019 | Choi | B06B 1/0692 |
| 2019/0205594 A1* | 7/2019 | Lee | H01L 51/0097 |
| 2019/0227603 A1* | 7/2019 | Noh | G06F 1/1626 |
| 2019/0341433 A1* | 11/2019 | Im | H01L 27/3276 |
| 2020/0004364 A1* | 1/2020 | Jung | H04M 1/0266 |
| 2020/0043991 A1* | 2/2020 | Noh | H04R 7/04 |
| 2020/0059713 A1 | 2/2020 | Noh et al. | |
| 2020/0107088 A1* | 4/2020 | Ahn | G06F 3/165 |
| 2020/0314513 A1* | 10/2020 | Park | H04R 7/04 |
| 2021/0092528 A1* | 3/2021 | Lee | H04R 1/025 |

FOREIGN PATENT DOCUMENTS

| | | |
|---|---|---|
| CN | 108566464 A | 9/2018 |
| CN | 109218930 A | 1/2019 |
| CN | 109656318 A | 4/2019 |
| CN | 109949700 A | 6/2019 |
| CN | 110650414 A | 1/2020 |
| CN | 110830613 A | 2/2020 |
| CN | 110881159 A | 3/2020 |
| KR | 20120128254 A | 11/2012 |

* cited by examiner

DISPLAY PANEL BUFFERING STRUCTURE, DISPLAY SCREEN MODULE AND MANUFACTURING METHOD THEREFOR, AND TERMINAL DEVICE

CROSS REFERENCE TO RELATED APPLICATIONS

This application is a national phase entry under 35 U.S.C. § 371 of International Application No. PCT/CN2020/093408, filed on May 29, 2020, which claims the priority of Chinese Patent Application No. 201910464036.8 filed with the China National Intellectual Property Administration on May 30, 2019, entitled 'Display Panel Buffering Structure, Display Screen Module and Preparing Method Therefor, and Terminal Device', the entire contents of which are incorporated herein by reference.

FIELD

This application relates to the technical field of electronic devices, and particularly, relates to a display panel buffering structure, a display screen module and a preparing method therefor, and a terminal device.

BACKGROUND

With increase of demands of customers on screen-to-body ratios of terminals such as a mobile phone, related manufacturers are considering removing sound production assemblies such as a loudspeaker and the like, and thus, the screen sound production technology emerges. The existing screen sound production technology is very liable to influence the quality of a display panel and influence the yield of a display product.

SUMMARY

This application discloses a display panel buffering structure, a display screen module and a preparing method therefor, and a terminal device, for solving a technical problem of reduction of the quality of a display panel, which is caused by a screen sound production technology.

For solving the technical problem, the application provides the following technical solutions.

A display screen module includes a display panel, an exciter and a display panel buffering structure. The display panel buffering structure is arranged on a side face, facing away from a light-emitting side, of the display panel, and includes:
  a buffering film provided with a hollow structure for accommodating the exciter; and
  a first light shielding film attached to a first side face, facing the display panel, of the buffering film.

An orthographic projection of the first light shielding film on a plane where the first side face is located covers an orthographic projection of the hollow structure on the plane where the first side face is located, and a portion, arranged opposite to the hollow structure, of the first light shielding film is fixed with the exciter.

The exciter is arranged in the hollow structure and fixed with the first light shielding film.

Optionally, the display panel buffering structure further includes a first heat dissipation film.

The first heat dissipation film is arranged between the first light shielding film and the buffering film, or the first heat dissipation film is arranged on a side face, facing away from the buffering film, of the first light shielding film.

Optionally, the display panel buffering structure further includes a second heat dissipation film. The second heat dissipation film is arranged on a second side face, opposite to the first side face, of the buffering film.

An orthographic projection of the second heat dissipation film on a plane where the second side face is located is not overlapped with an orthographic projection of the hollow structure on the plane where the second side face is located.

Optionally, the display panel buffering structure includes the first heat dissipation film and/or the second heat dissipation film. The material of the first heat dissipation film and the second heat dissipation film includes a copper foil, a silver foil, an aluminum foil and a graphene film.

Optionally, the display panel buffering structure further includes a second light shielding film. The second light shielding film is arranged on a second side face, opposite to the first side face, of the buffering film.

An orthographic projection of the second light shielding film on the plane where the second side face is located is not overlapped with an orthographic projection of the hollow structure on the plane where the second side face is located.

Optionally, a grid-shaped protrusion structure is arranged on a side face, connected to the display panel, of the first light shielding film.

Optionally, the first light shielding film includes a grid adhesive.

Optionally, a heat dissipation adhesive is filled between the exciter and a side wall of the hollow structure.

Optionally, a distance from a central point of an orthographic projection of the hollow structure on the display panel to any one edge of the display panel is greater than or equal to about 5 mm.

Optionally, the display panel includes a top edge and a bottom edge which are oppositely arranged.

A distance from the central point of the orthographic projection of the hollow structure on the display panel to the top edge of the display panel is about 5 mm to 25 mm.

A distance, along a direction in parallel to the top edge, from the central point of the orthographic projection of the hollow structure on the display panel to a midperpendicular of the top edge is about 0 mm to 20 mm.

Optionally, the distance from the central point of the orthographic projection of the hollow structure on the display panel to the top edge of the display panel is about 5 mm.

The orthographic projection of the hollow structure on the display panel is located at the midperpendicular of the display panel.

A method for preparing the any one of the above display screen modules at least includes:
  attaching the display panel buffering structure to the side face, facing away from the light-emitting side, of the display panel;
  fixing the exciter in the hollow structure; and
  fixing the exciter with the first light shielding film.

Optionally, the method further includes: filling a heat dissipation adhesive between the exciter and the side wall of the hollow structure.

A terminal device includes the display screen module according to the above technical solutions.

A display panel buffering structure is arranged on a side face, facing away from a light-emitting side, of a display panel, and includes:
  a buffering film provided with a hollow structure for accommodating an exciter; and a first light shielding film attached to a first side face, facing the display panel, of the buffering film.

An orthographic projection of the first light shielding film on a plane where the first side face is located covers an orthographic projection of the hollow structure on the plane where the first side face is located, and a portion, arranged opposite to the hollow structure, of the first light shielding film is fixed with the exciter.

Optionally, the display panel buffering structure further includes a first heat dissipation film.

The first heat dissipation film is arranged between the first light shielding film and the buffering film, or the first heat dissipation film is arranged on a side face, facing away from the buffering film, of the first light shielding film.

Optionally, the display panel buffering structure further includes a second heat dissipation film. The second heat dissipation film is arranged on a second side face, opposite to the first side face, of the buffering film.

An orthographic projection of the second heat dissipation film on a plane where the second side face is located is not overlapped with an orthographic projection of the hollow structure on the plane where the second side face is located.

Optionally, the display panel buffering structure further includes a second light shielding film. The second light shielding film is arranged on the second side face, opposite to the first side face, of the buffering film.

An orthographic projection of the second light shielding film on the plane where the second side face is located is not overlapped with an orthographic projection of the hollow structure on the plane where the second side face is located.

A grid-shaped protrusion structure is arranged on a side face, connected to the display panel, of the first light shielding film.

Optionally, the first light shielding film includes a grid adhesive.

DETAILED DESCRIPTION OF THE EMBODIMENTS

In order to enable a screen to vibrate to produce sound, generally, an exciter is arranged on a side face, facing away from a light-emitting side, of a display panel. However, for a display panel with relatively high light transmittance, e.g., a top-emitting flexible Organic Light-Emitting Diode (OLED) panel, its substrate is relatively thin, resulting in that a place where the exciter is placed turns yellow to influence the display quality.

Figure 10:
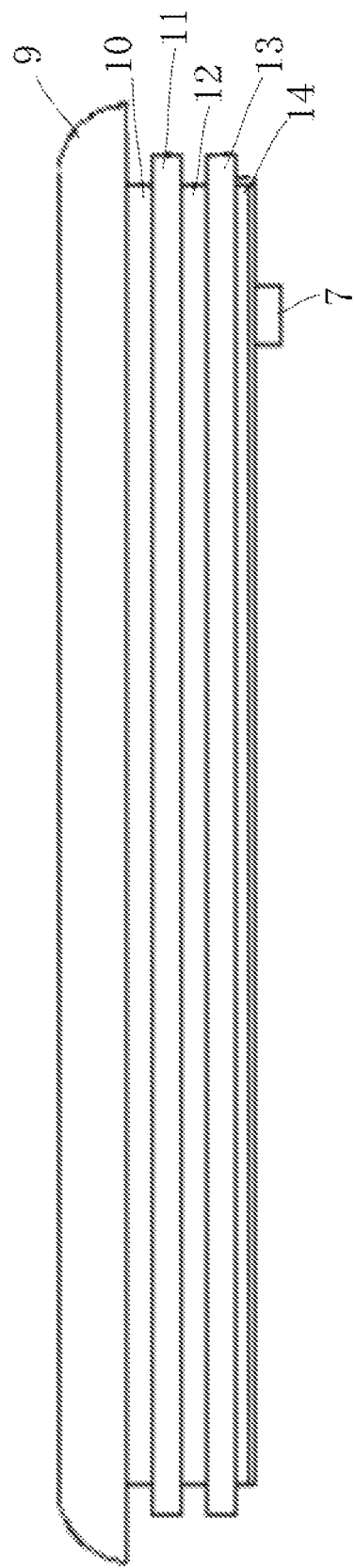
FIG. 10 is a structural schematic diagram of a display screen module in the related art.

The display quality is easily influenced by arranging the exciter on the side face, facing away from the light-emitting side, of the display panel, and thus, in the related art, the exciter is arranged on a buffering structure located at a back face of the display panel. Specifically referring to FIG. 10, a display screen module includes a display panel 13. A polarizer 11 and a glass cover plate 9 are sequentially arranged on the light-emitting side of the display panel 13. The glass cover plate 9 is adhered to the polarizer 11 by a first optical transparent adhesive layer 10. The display panel 13 is adhered to the polarizer 11 by a second optical transparent adhesive layer 12. A buffering structure 14 is arranged on a side face, facing away from the light-emitting side, of the display panel. An exciter 7 is arranged on a side face, facing away from the display panel 13, of the buffering structure 14. Although the structure solution can avoid influence on the display quality of the display panel, it can cause great reduction of the sound production quality of a screen.

Therefore, embodiments of the present application disclose a display panel buffering structure, a display screen module and a preparing method therefor, and a terminal device, for avoiding influence on the display quality when an exciter is directly arranged on a display panel in one aspect and meanwhile, avoiding reduction of the sound production quality when the exciter is arranged on the buffering structure, so that the quality of a screen sound production type display panel can be effectively improved.

Technical solutions of embodiments of the present application will be described clearly and sufficiently in combination with accompanying drawings in the embodiments of the present application. It is obvious that the described embodiments are just a part but not all of the embodiments of the present application. Based on the embodiments of the present application, all other embodiments obtained by those of ordinary skill in the art without any inventive work should fall within the scope of protection of the present application.

Figure 1:
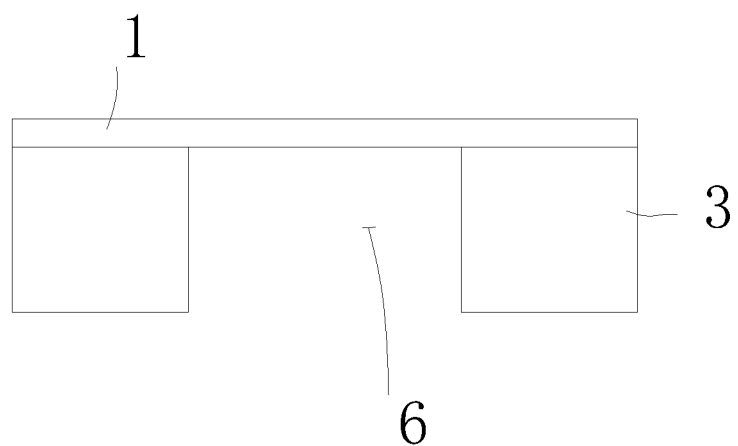
FIG. 1 is a partially sectional structural schematic diagram of a display panel buffering structure provided by an embodiment of the present application.
Figure 2:
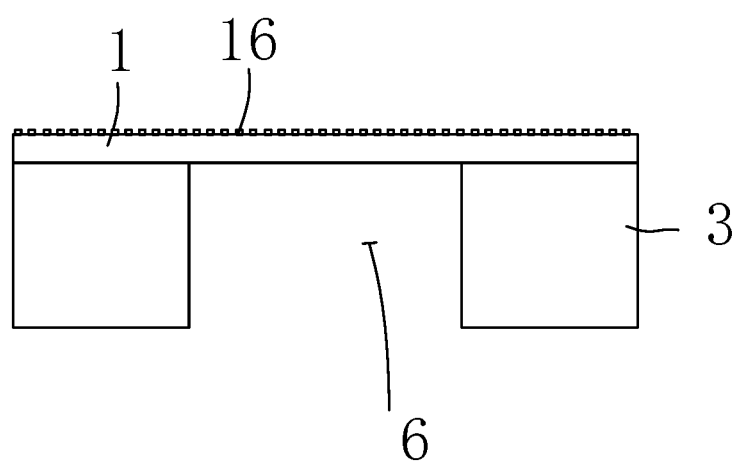
FIG. 2 is a partially sectional structural schematic diagram of a display panel buffering structure provided by another embodiment of the present application.
Figure 3:
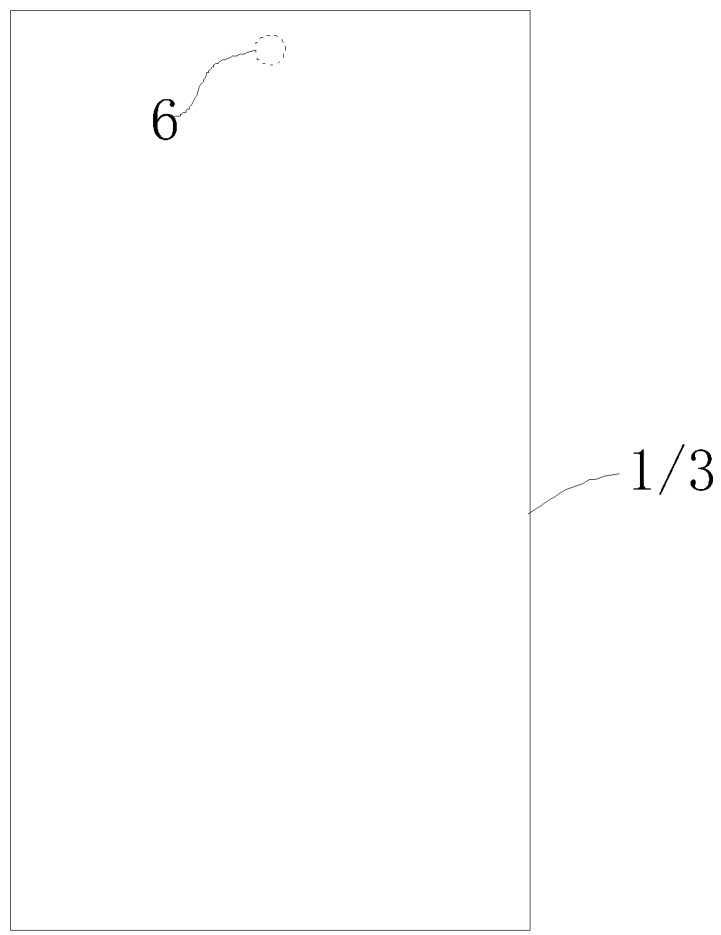
FIG. 3 is a top view of the display panel buffering structure in FIG. 1 and FIG. 2.
Figure 4:
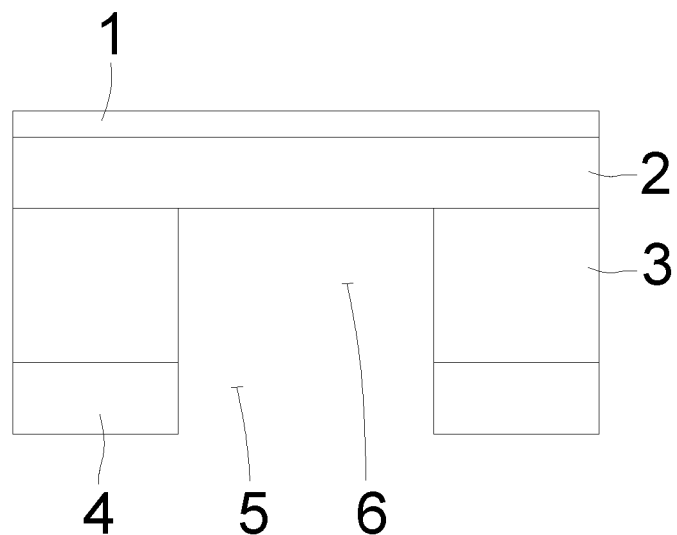
FIG. 4 is a partially sectional structural schematic diagram of a display panel buffering structure provided by yet another embodiment of the present application.
Figure 5:
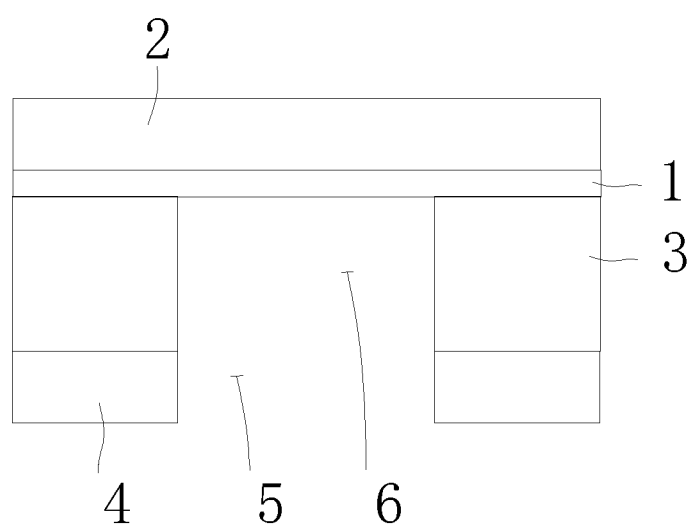
FIG. 5 is a partially sectional structural schematic diagram of a display panel buffering structure provided by still a further embodiment of the present application.
Figure 6:
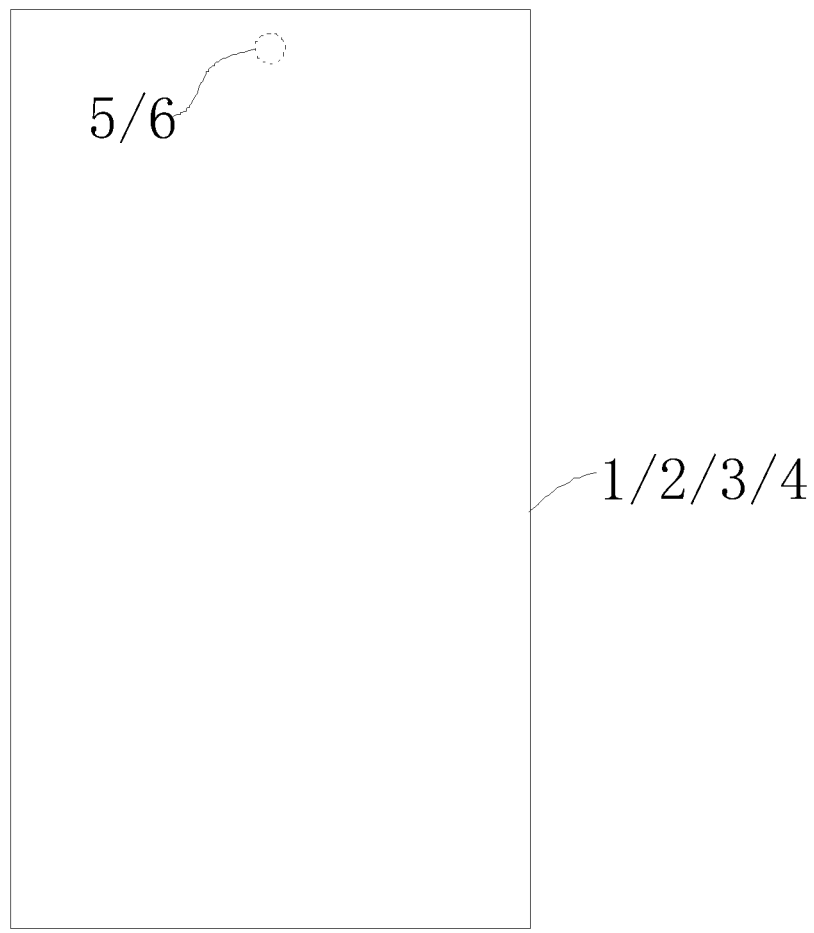
FIG. 6 is a top view of the display panel buffering structure in FIG. 4 and FIG. 5.
Figure 7:
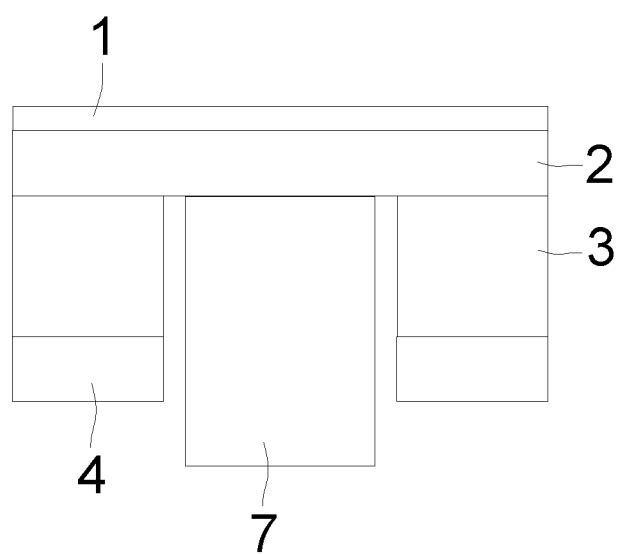
FIG. 7 is a partially sectional structural schematic diagram of a hollow structure in a display panel buffering structure provided by an embodiment of the present application after an exciter is installed.
Figure 8:
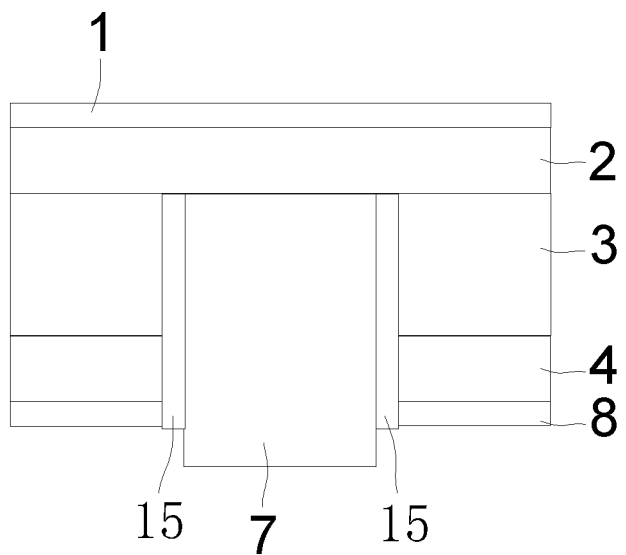
FIG. 8 is a partially sectional structural schematic diagram of a hollow structure in a display panel buffering structure provided by another embodiment of the present application after an exciter is installed.
Figure 9:
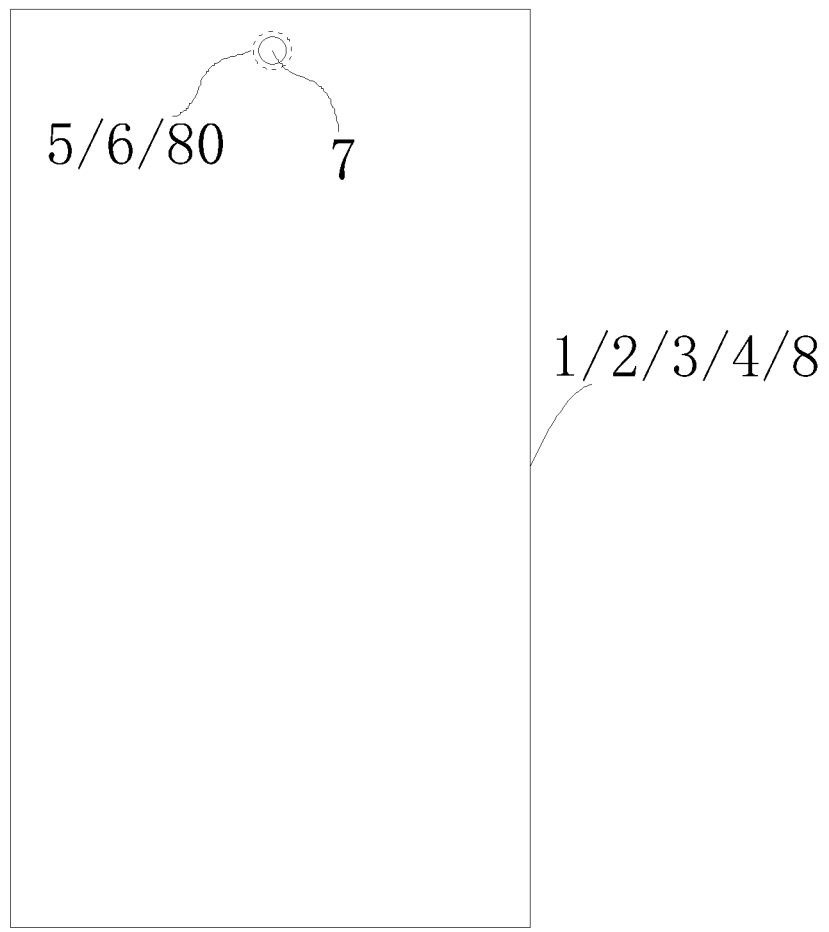
FIG. 9 is a top view of the display panel buffering structure in FIG. 8.

Specifically, firstly, please refer to FIG. 1 to FIG. 9. FIGS. 1, 2, 4, 5, 7 and 8 are sectional views. FIGS. 3, 6 and 9 are top views. Reference signs '/' in FIGS. 3, 6 and 9 represent a plurality of structures. For example, the reference sign '1/3' in FIG. 3 represents that two layers of structures of a first light shielding film 1 and a buffering film 3 are laminated together, and the reference sign '5/6' in FIG. 6 represents that a hollow structure 6 of the buffering film 3 is overlapped with a through hole 5 formed in a second heat dissipation film 4.

A display panel buffering structure provided by embodiments of the present application is arranged on a side face, facing away from a light-emitting side, of a display panel. As shown in FIG. 1 to FIG. 3, the display panel buffering structure includes:

a buffering film 3 provided with a hollow structure 6 for accommodating an exciter 7; and a first light shielding film 1, attached to a first side face of the buffering film 3, which is facing the display panel.

An orthographic projection of the first light shielding film 1 on a plane where the first side face is located covers an orthographic projection of the hollow structure 6 on the plane where the first side face is located, and a portion of the first light shielding film 1, which is arranged opposite to the hollow structure 6, is fixed with the exciter.

The above "hollow structure 6" not only can be a through hole penetrating through a middle portion of the buffering film 3, but also can be an inner groove formed in an edge of the buffering film 3 and sunken towards the inside of the buffering film 3, and a material of the buffering film 3 includes, but is not limited to, foam and sponge, as long as the material has a buffering effect. The orthographic projection of the first light shielding film 1 completely covers the orthographic projection of the hollow structure 6, and may completely cover the first side face of the buffering film 3.

In the display panel buffering structure, as shown in FIG. 1 to FIG. 3, the first light shielding film 1 is attached to the first side face, facing the display panel, of the buffering film 3. When the display panel buffering structure is mounted on a back face of the display panel, the side face of the first light shielding film 1, which faces away from the buffering film 3, is attached to the display panel. The buffering film 3 is provided with the hollow structure 6 and the hollow structure 6 is covered by the first light shielding film 1, so that the exciter 7 can be arranged in the hollow structure 6 and the exciter 7 can be fixed with the first light shielding film 1 as shown in FIG. 7 and FIG. 8. The first light shielding film 1 has a light shielding effect, so that the exciter 7 is shielded by the first light shielding film 1. On a light-emitting side of the display panel, a user cannot see the exciter 7 easily, a case that the display panel is partially indented and turns yellow cannot occur easily, and the first light shielding film 1 also can avoid influence on the display panel caused by a light source in a terminal device. Moreover, the exciter 7 is arranged in the hollow structure 6, so that energy generated by vibration of the exciter 7 produces sound directly by vibration of film layers such as the first light shielding film 1 and a substrate in the display panel, without passing through the buffering film 3, so as to be incapable of being absorbed by the buffering film 3 in the process of transferring the energy to the display panel, and thus the sound production quality can be improved. Therefore, the above arrangement of the display panel buffering structure can simultaneously improve the display quality and the sound production quality of a screen sound production type display screen module and effectively improve the quality of the display screen module.

Moreover, the buffering film 3 is provided with the hollow structure 6 for accommodating the exciter 7, and thus, when the exciter 7 is arranged in the hollow structure 6, a total thickness of the exciter 7 and the display panel buffering structure is reduced so as to benefit for implementing lightness and thinness. For example, by taking a case that a thickness of the exciter 7 is 2.6 mm as an example, when a thickness of the buffering film 3 is 0.1 mm, the total thickness of the display panel buffering structure and the exciter 7 can be reduced by 0.1 mm.

In addition, a material of the first light shielding film 1 includes, but is not limited to, black rubber and black cloth.

Moreover, in order to enable the first light shielding film 1 not to be protruded when the first light shielding film 1 is attached to the display panel, as shown in FIG. 2, a grid-shaped protrusion structure 16 can be arranged on the side face, connected to the display panel, of the first light shielding film 1. Due to the grid-shaped protrusion structure 16, gas between the first light shielding film 1 and the display panel can be discharged through grooved structures of the protrusion structure, so that not only can it be ensured that the first light shielding film 1 is attached to the display panel, but also it is not liable to protrude, for example, a grid adhesive can be used as the first light shielding film 1, and specifically, a thickness of the grid adhesive may be about 30 μm.

In the above display panel buffering structure, the first light shielding film 1 can be directly attached to the buffering film 3, or other film layers can be arranged between the first light shielding film 1 and the buffering film 3, the other film layers may be not provided with holes corresponding to the hollow structure 6, the exciter 7 can be directly fixed on the other film layers, or the other film layers can be provided with holes corresponding to the hollow structure 6, so that the exciter passes through the hollow structure 6 and is attached to the first light shielding film 1.

The "other film layers" may be a first heat dissipation film 2. The first heat dissipation film 2 may be arranged between the first light shielding film 1 and the buffering film 3 as shown in FIG. 4, or as shown in FIG. 5, the first heat dissipation film 2 may be arranged on one side of the first light shielding film 1, which faces away from the buffering film 3. The arrangement of the first heat dissipation film 2 is beneficial to heat dissipation of the display panel so as to avoid accumulation of excessive heat in the display panel. The first heat dissipation film 2 includes, but is not limited to, a copper foil, a silver foil, an aluminum foil and a graphene film. Further, the first heat dissipation film 2 has a certain light shielding effect, can further avoid influence on the display panel caused by a light source in the terminal device, and can shield the exciter so as to prevent the exciter from influencing the display effect of the display panel.

Specifically, the first heat dissipation film 2 is the copper foil, and a thickness of the first heat dissipation film 2 is about 30 μm to 50 μm, for example, specifically may be 30 μm, 35 μm, 40 μm, 45 μm and 50 μm.

As shown in FIG. 4 and FIG. 5, the second heat dissipation film 4 is arranged on a second side face, arranged opposite to the first side face, of the buffering film 3.

Specifically, an orthographic projection of the second heat dissipation film 4 on a plane where the second side face of the buffering film 3 is located is not overlapped with an orthographic projection of the hollow structure 6 on the plane where the second side face is located. As shown in FIG. 4 to FIG. 6, a through hole 5 can be formed in a position, opposite to the hollow structure 6, on the second heat dissipation film 4, and the exciter passes through the through hole 5 to enter the hollow structure 6, or an edge of the second heat dissipation film 4 does not extend to the position of the hollow structure 6, and it can be understood as a case that the orthographic projection of the hollow structure 6 on the second side face of the buffering film 3 is separate from the orthographic projection of the second heat dissipation film 4 on the second side face of the buffering film 3. The second heat dissipation film 4 can introduce heat dissipated into the buffering film 3 from the display panel to be out of the display screen module as quickly as possible so as to avoid heat accumulation in the buffering film 3. Further, when the first heat dissipation film 2 is arranged on the first side face of the buffering film 3, the first heat dissipation film 2 cooperates with the second heat dissipation film 4, so that discharging of heat in the display panel can be further accelerated, thereby promoting performance of the display panel.

The second heat dissipation film 4 includes, but is not limited to, a copper foil, a silver foil, an aluminum foil and a graphene film.

In the above display panel buffering structure, in order to further avoid influence on the display effect of the display panel caused by the light source in the terminal device, as shown in FIG. 8, a second light shielding film 8 can be arranged on the second side face, opposite to the first side face, of the buffering film 3.

An orthographic projection of the second light shielding film 8 on the plane where the second side face is located is not overlapped with the orthographic projection of the hollow structure 6 on the plane where the second side face is located. As shown in FIG. 9, the second light shielding film 8 may be provided with a through hole 80 opposite to the hollow structure 6, or the second light shielding film 8 does not extend to the hollow structure 6, and a material of the second light shielding film 8 may be rubber, black cloth and the like.

When there is the second heat dissipation film 4, the second light shielding film 8 not only can be, as shown in FIG. 8, arranged on the side face, facing away from the buffering film 3, of the second heat dissipation film 4, but also can be arranged between the second heat dissipation film 4 and the buffering film 3.

Figure 11:
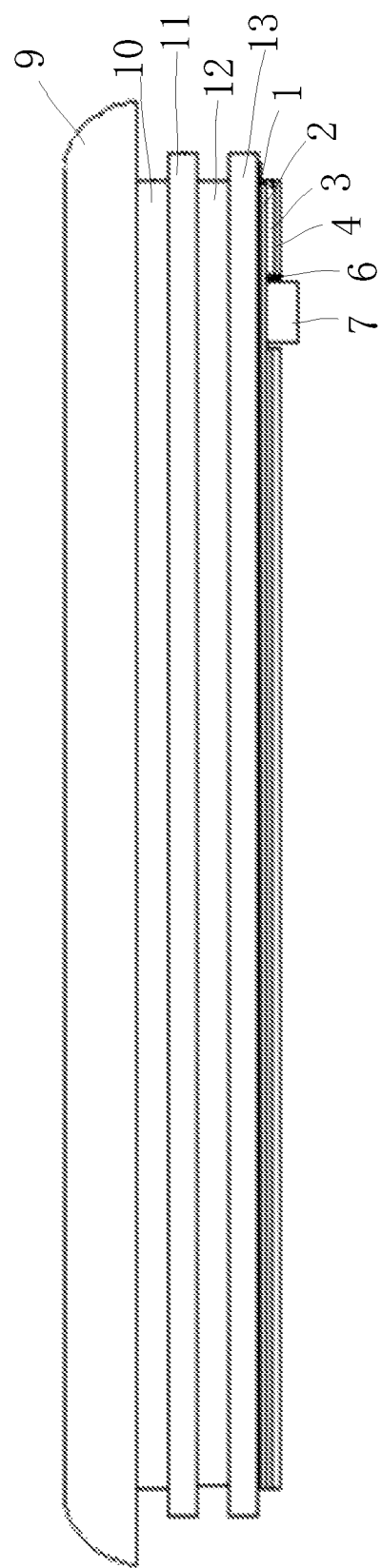
FIG. 11 is a structural schematic diagram of a display screen module provided by an embodiment of the present application.

On the basis of the same inventive concept, embodiments of the present application provides a display screen module. With reference to FIG. 11, the display screen module includes: a display panel 13, an exciter 7 and the display panel buffering structure as provided above.

The first light shielding film 1 in the display panel buffering structure is attached to a side face, facing away from a light-emitting side, of a display panel 13.

The exciter 7 is arranged in the hollow structure 6, and is fixed with the first light shielding film 1.

Specifically, with reference to FIG. 11, the display screen module includes the display panel 13. A polarizer 11 and a glass cover plate 9 are sequentially arranged on the light-emitting side of the display panel 13. The glass cover plate 9 is adhered to the polarizer 11 by a first optical transparent adhesive layer 10. The display panel 13 is adhered to the polarizer 11 by a second optical transparent adhesive layer 12. The first light shielding film 1, the first heat dissipation film 2, the buffering film 3 and the second heat dissipation film 4 are sequentially arranged on the side face, facing away from the light-emitting side, of the display panel 13. The first light shielding film 1, the first heat dissipation film 2, the buffering film 3 and the second heat dissipation film 4 form the display panel buffering structure as mentioned above. The buffering film 3 is provided with the hollow structure 6. The second heat dissipation film 4 is provided with a through hole 5 opposite to the hollow structure 6. The exciter 7 is arranged in the hollow structure 6 and fixedly adhered to the first heat dissipation film 2.

In above the display screen module, the first light shielding film 1 in the display panel buffering structure is attached to the first side face, facing the display panel 13, of the buffering film 3. When the display panel buffering structure is installed at the back face of the display panel 13, the side face of the first light shielding film 1, which faces away from the buffering film 3, is attached to the display panel 13. The buffering film 3 is provided with the hollow structure 6 and the hollow structure 6 is covered by the first light shielding film 1, so that the exciter 7 can be arranged in the hollow structure 6 and the exciter 7 can be fixed with the first light shielding film 1. The first light shielding film 1 has the light shielding effect, so that the exciter 7 is shielded by the first light shielding film 1. On the light-emitting side of the display panel 13, a user cannot see the exciter 7 easily, and further, the case that the display panel 13 partially turns yellow cannot occur easily. Moreover, the exciter 7 is arranged in the hollow structure 6, so that the energy generated by vibration of the exciter 7 produces sound directly by vibration of film layers such as the first light shielding film 1 and a substrate in the display panel 13, without passing through the buffering film 3, so as to be incapable of being absorbed by the buffering film 3 in the process of transferring the energy to the display panel 13, and thus the sound production quality is improved. In addition, the buffering film 3 is provided with the hollow structure 6 for accommodating the exciter 7, so that when the exciter 7 is arranged in the hollow structure 6, a total thickness of the exciter 7 and the display panel buffering structure is reduced so as to benefit for implementing lightness and thinness of the display screen module.

In addition, as shown in FIG. 8, in order to sufficiently dissipate heat in the exciter 7, a heat dissipation adhesive 15 is filled between the exciter 7 and a side wall of the hollow structure 6, and the heat dissipation adhesive 15 may be a conductive adhesive.

In addition, a distance from a central point of an orthographic projection of the hollow structure 6 on the display panel 13 to any one edge of the display panel 13 is greater than or equal to about 5 mm, for example, may be 5 mm, 6 mm, 7 mm, 8 mm, 10 mm, 15 mm, 20 mm, 25 mm, 30 mm and the like. When the distance from the hollow structure to any one edge of the display panel 13 is smaller than 5 mm, due to the excessively short distance from the exciter 7 to the display panel 13, vibration of the edge of the display panel 13 is intensified and heat is emitted, so that the temperature is increased, and the light shielding effect of the first light shielding film 1 may be poor in this case, resulting in that the user watching the display screen module see that the position of the exciter 7 turns yellow.

Specifically, in order to facilitate answering by the user, an orthographic projection S of the hollow structure 6 on the display panel 13 can be located near a top edge 131 of the display panel 13. For example, with reference to FIG. 12, the display panel 13 includes the top edge 131 and a bottom edge 132 which are oppositely arranged. A distance from the central point of the orthographic projection S of the hollow structure 6 on the display panel 13 to the top edge 131 of the display panel 13 is about 5 mm to 25 mm, for example, may be 5 mm, 6 mm, 7 mm, 8 mm, 9 mm, 10 mm, 15 mm, 20 mm, 25 mm and the like. A distance, along a direction in parallel to the top edge 131, from the central point of the orthographic projection S of the hollow structure 6 to a midperpendicular 133 of the top edge 131 is about 0 mm to 20 mm, for example, may be 0 mm, 3 mm, 5 mm, 9 mm, 10 mm, 15 mm and 20 mm.

It should be noted that in a numerical range of the embodiments of the present application, the description related to "about" or "approximately" means that there may be a certain fluctuation within the central numerical range. For example, there may be fluctuation within a range of plus and minus 5%. Specifically, "about 5 mm" means that there may be fluctuation within a range of 4.75 mm to 5.25 mm. In the present application, the "top edge of the display panel" means a linear segment included in the top edge of the display panel. By taking a mobile phone module as an example, a corner of a display panel of the mobile phone module generally is an arc angle, and thus the top edge of the display panel refers to a linear segment between arc angles of two ends.

Figure 12:
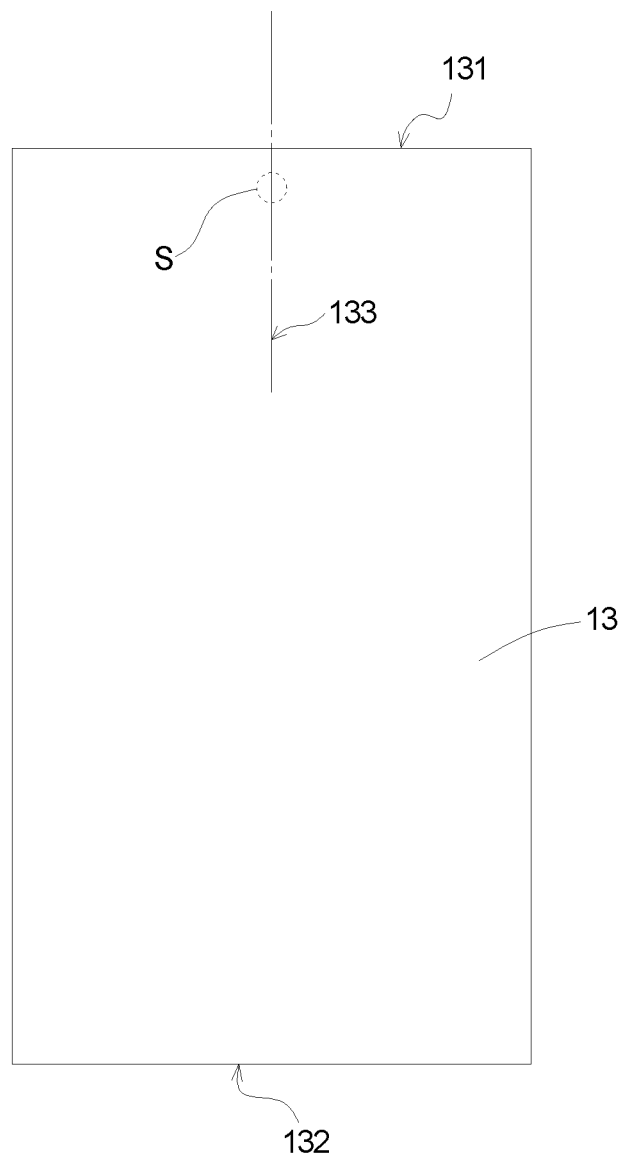
FIG. 12 is a structural schematic diagram of a display panel in a display screen module provided by an embodiment of the present application.

As one specific embodiment, as shown in FIG. 12, the distance from the orthographic projection S of the hollow structure 6 on the display panel 13 to the top edge 131 of the display panel 13 is about 5 mm; and the orthographic projection S of the hollow structure 6 on the display panel 13 is located at the midperpendicular 133 of the display panel 13.

It should be noted that the position of the hollow structure 6 is not limited to the region and specifically can be regulated according to interactions between the exciter 7 and other devices. For example, the exciter 7 generates more heat, resulting in influence on performance of other devices, or other devices generate electromagnetic interference to the exciter 7, and in order to avoid these interactions between the exciter 7 and other devices, in the practical application, the position of the exciter 7 (i.e., the hollow structure 6) can be regulated according to the positions of the other devices.

In addition, in FIG. 12, the orthographic projection S of the hollow structure 6 on the display panel 13 is of a round shape, the hollow structure 6 is not limited to the above shape in the practical application. For example, the orthographic projection S of the hollow structure 6 on the display panel 13 also may be of an oval shape, a polygon shape (e.g., triangle, rectangle, trapezoid, parallelogram and the like) and other irregular shapes.

On the basis of the same inventive concept, embodiments of the present application provide a method for preparing a display screen module, at least including:

attaching the display panel buffering structure according to the above technical solution to a side face, facing away from a light-emitting side, of a display panel 13;

fixing an exciter 7 in a hollow structure 6; and fixing the exciter 7 with a first light shielding film 1.

In the method for preparing the display screen module, the display panel buffering structure is attached to the display panel 13, the exciter 7 is fixed in the hollow structure 6, and the exciter 7 is fixed with a first light shielding film 1. The light shielding film can shield the exciter 7, so that the user cannot see such a case that the position on the display panel 13, which is opposite to the exciter 7, turns yellow easily. In addition, when vibration generated by the exciter 7 is transferred, energy is transferred to film layers such as a substrate in the display panel 13 directly by the first light shielding film 1, without passing through the buffering film 3, so as to be incapable of being absorbed by the buffering film 3, and thus, the screen sound production quality is greatly improved. Moreover, the buffering film 3 is provided with the hollow structure 6 for accommodating the exciter 7, so that when the exciter 7 is arranged in the hollow structure 6, the total thickness of the exciter 7 and the display panel buffering structure is reduced so as to benefit for implementing lightness and thinness.

In addition, the method for preparing the display screen module provided by the embodiments of the present application further includes: filling a heat dissipation adhesive between the exciter 7 and a side wall of the hollow structure 6 so as to improve heat dissipation efficiency of the exciter 7.

On the basis of the same inventive concept, embodiments of the present application further provide a terminal device, including the above display screen module.

In the above terminal device, as shown in FIG. 11, the first light shielding film 1 of the display panel buffering structure is attached to the first side face, facing the display panel 13, of the buffering film 3. When the display panel buffering structure is installed at the back face of the display panel 13, the side face of the first light shielding film 1, which faces away from the buffering film 3, is attached to the display panel 13. The buffering film 3 is provided with the hollow structure 6 and the hollow structure 6 is covered by the first light shielding film 1. The exciter 7 can be arranged in the hollow structure 6. The exciter 7 can be fixed with the first light shielding film 1. The first light shielding film 1 has the light shielding effect, so that the exciter 7 is shielded by the first light shielding film 1. On the light-emitting side of the display panel 13, the user cannot see the exciter 7 easily, and the case that the display panel 13 partially turns yellow cannot occur easily. Moreover, the exciter 7 is arranged in the hollow structure 6, so that the energy generated by vibration of the exciter 7 produces sound directly by vibration of film layers such as the first light shielding film 1, and a substrate in the display panel 13, without passing through the buffering film 3, so as to be incapable of being absorbed by the buffering film 3 in the process of transferring the energy to the display panel 13, and thus the sound production quality is improved. In addition, the buffering film 3 is provided with the hollow structure 6 for accommodating the exciter 7, so that when the exciter 7 is arranged in the hollow structure 6, the total thickness of the exciter 7 and the display panel buffering structure is reduced so as to benefit for implementing lightness and thinness.

Obviously, those skilled in the art can make various changes or modifications to the embodiments of the present application without departure from the spirit and scope of the present application. Thus, if these changes and modifications to the present application are within the scope of the claims of the present application and equivalent technologies thereof, the present application also intends to include all such changes and modifications within its scope.

What is claimed is:

1. A display screen module, comprising:
   a display panel;
   an exciter; and
   a display panel buffering structure;
   wherein the display panel buffering structure is arranged on a side face, facing away from a light-emitting side, of the display panel, and comprises:
   a buffering film provided with a hollow structure for accommodating the exciter;
   a first light shielding film attached to a first side face, facing the display panel, of the buffering film; and
   a second light shielding film arranged on a second side face, opposite to the first side face, of the buffering film;
   wherein an orthographic projection of the first light shielding film on a plane where the first side face is located covers an orthographic projection of the hollow structure on the plane where the first side face is located;
   a portion, arranged opposite to the hollow structure, of the first light shielding film is fixed with the exciter;
   the exciter is arranged in the hollow structure and fixed with the first light shielding film; and
   an orthographic projection of the second light shielding film on the plane where the second side face is located is not overlapped with an orthographic projection of the hollow structure on the plane where the second side face is located.

2. The display screen module according to claim 1, wherein the display panel buffering structure further comprises:
a first heat dissipation film;
wherein the first heat dissipation film is arranged:
between the first light shielding film and the buffering film; or
on a side face, facing away from the buffering film, of the first light shielding film.

3. The display screen module according to claim 1, wherein the display panel buffering structure further comprises:
a second heat dissipation film;
wherein the second heat dissipation film is arranged on the second side face, opposite to the first side face, of the buffering film; and
an orthographic projection of the second heat dissipation film on a plane where the second side face is located is not overlapped with an orthographic projection of the hollow structure on the plane where the second side face is located.

4. The display screen module according to claim 2, wherein a material of the first heat dissipation film comprises a copper foil, a silver foil, an aluminum foil and a graphene film.

5. The display screen module according to claim 1, wherein a grid-shaped protrusion structure is arranged on a side face, connected to the display panel, of the first light shielding film.

6. The display screen module according to claim 5, wherein the first light shielding film comprises a grid adhesive.

7. The display screen module according to claim 1, wherein a heat dissipation adhesive is filled between the exciter and a side wall of the hollow structure.

8. The display screen module according to claim 1, wherein a distance from a central point of an orthographic projection of the hollow structure on the display panel to any one edge of the display panel is greater than or equal to about 5 mm.

9. The display screen module according to claim 8, wherein the display panel comprises a top edge and a bottom edge which are oppositely arranged;
a distance from the central point of the orthographic projection of the hollow structure on the display panel to the top edge of the display panel is about 5 mm to 25 mm; and
a distance, along a direction parallel to the top edge, from the central point of the orthographic projection of the hollow structure on the display panel to a midperpendicular of the top edge is about 0 mm to 20 mm.

10. The display screen module according to claim 9, wherein the distance from the central point of the orthographic projection of the hollow structure on the display panel to the top edge of the display panel is about 5 mm; and
the orthographic projection of the hollow structure on the display panel is located at the midperpendicular of the display panel.

11. A method for preparing the display screen module according to claim 1, at least comprising:
attaching the display panel buffering structure to the side face, facing away from the light-emitting side, of the display panel;
fixing the exciter in the hollow structure; and
fixing the exciter with the first light shielding film.

12. The method for preparing the display screen module according to claim 11, further comprising:
filling a heat dissipation adhesive between the exciter and a side wall of the hollow structure.

13. A terminal device, comprising the display screen module according to claim 1.

14. A display panel buffering structure, arranged on a side face, facing away from a light-emitting side, of a display panel, and comprising:
a buffering film, provided with a hollow structure for accommodating an exciter; and
a first light shielding film attached to a first side face, facing the display panel, of the buffering film; and
a second light shielding film arranged on a second side face, opposite to the first side face, of the buffering film;
wherein an orthographic projection of the first light shielding film on a plane where the first side face is located covers an orthographic projection of the hollow structure on the plane where the first side face is located;
a portion, arranged opposite to the hollow structure, of the first light shielding film is fixed with the exciter; and
an orthographic projection of the second light shielding film on the plane where the second side face is located is not overlapped with an orthographic projection of the hollow structure on the plane where the second side face is located.

15. The display panel buffering structure according to claim 14, further comprising:
a first heat dissipation film;
wherein the first heat dissipation film is arranged:
between the first light shielding film and the buffering film; or
on a side face, facing away from the buffering film, of the first light shielding film.

16. The display panel buffering structure according to claim 14, further comprising:
a second heat dissipation film;
wherein the second heat dissipation film is arranged on the second side face, opposite to the first side face, of the buffering film; and
an orthographic projection of the second heat dissipation film on a plane where the second side face is located is not overlapped with an orthographic projection of the hollow structure on the plane where the second side face is located.

17. The display panel buffering structure according to claim 14,
wherein a grid-shaped protrusion structure is arranged on a side face, connected to the display panel, of the first light shielding film.

18. The display panel buffering structure according to claim 14, wherein the first light shielding film comprises a grid adhesive.

19. The display screen module according to claim 3, wherein a material of the second heat dissipation film comprises a copper foil, a silver foil, an aluminum foil and a graphene film.

20. A display screen module, comprising:
a display panel;
an exciter; and
a display panel buffering structure;
wherein the display panel buffering structure is arranged on a side face, facing away from a light-emitting side, of the display panel, and comprises:
a buffering film provided with a hollow structure for accommodating the exciter; and
a first light shielding film attached to a first side face, facing the display panel, of the buffering film;

wherein an orthographic projection of the first light shielding film on a plane where the first side face is located covers an orthographic projection of the hollow structure on the plane where the first side face is located;

a portion, arranged opposite to the hollow structure, of the first light shielding film is fixed with the exciter;

the exciter is arranged in the hollow structure and fixed with the first light shielding film and a heat dissipation adhesive is filled between the exciter and a side wall of the hollow structure.

\* \* \* \* \*